[19] United States Patent
Casti

[11] Patent Number: 5,445,887
[45] Date of Patent: Aug. 29, 1995

[54] DIAMOND COATED MICROCOMPOSITE SINTERED BODY

[76] Inventor: Thomas E. Casti, 2808 Fawkes Dr., Wilmington, Del. 19808

[21] Appl. No.: 147,103

[22] Filed: Nov. 3, 1993

Related U.S. Application Data

[63] Continuation of Ser. No. 816,356, Dec. 27, 1991, abandoned.

[51] Int. Cl.⁶ .................................................. B32B 9/00
[52] U.S. Cl. ........................................ 428/408; 51/307; 51/309; 501/92; 501/96; 501/97; 501/98; 428/698; 428/446; 428/697; 428/704
[58] Field of Search ............... 501/92, 96, 97, 98; 428/408, 698, 446, 697, 699, 704; 51/307, 309

[56] References Cited

U.S. PATENT DOCUMENTS

| | | | |
|---|---|---|---|
| 4,093,687 | 6/1978 | Greskovich et al. | 501/97 |
| 4,407,971 | 10/1983 | Komatsu et al. | 501/96 |
| 4,598,024 | 7/1986 | Stinton et al. | 428/698 |
| 4,612,296 | 9/1986 | Sakamoto et al. | 501/97 |
| 4,707,384 | 6/1987 | Schachner et al. | 427/249 |
| 4,731,296 | 6/1987 | Kikuchi et al. | 428/552 |
| 4,767,608 | 10/1987 | Matsumoto et al. | 423/446 |
| 4,902,653 | 2/1989 | Komatsu et al. | 501/98 |
| 4,990,403 | 1/1990 | Ito | 428/408 |
| 5,023,214 | 4/1990 | Matsumoto et al. | 501/97 |
| 5,094,986 | 3/1992 | Matsumoto et al. | 501/97 |

FOREIGN PATENT DOCUMENTS 0286306 12/1988 European Pat. Off. .

OTHER PUBLICATIONS

Properties of diamond composite films grown on iron surfaces, Ong et al., Appl. Phys. Lett., vol. 58, No. 4, 28 Jan. 1991, (pp. 358–360).

Primary Examiner—Archene Turner

[57] ABSTRACT

A diamond coated metal silicide-containing composition selected from the group consisting of $Mi_xSi_y + Si_3N_4$ and $M_xSi_y + SiC$, wherein M is a transition metal selected from the group consisting of cobalt, iron, nickel, molybdenum, and mixtures thereof, and x and y each may be the same or a different integer, preferably wherein the ratio of x:y is $\geq 1$.

9 Claims, 1 Drawing Sheet

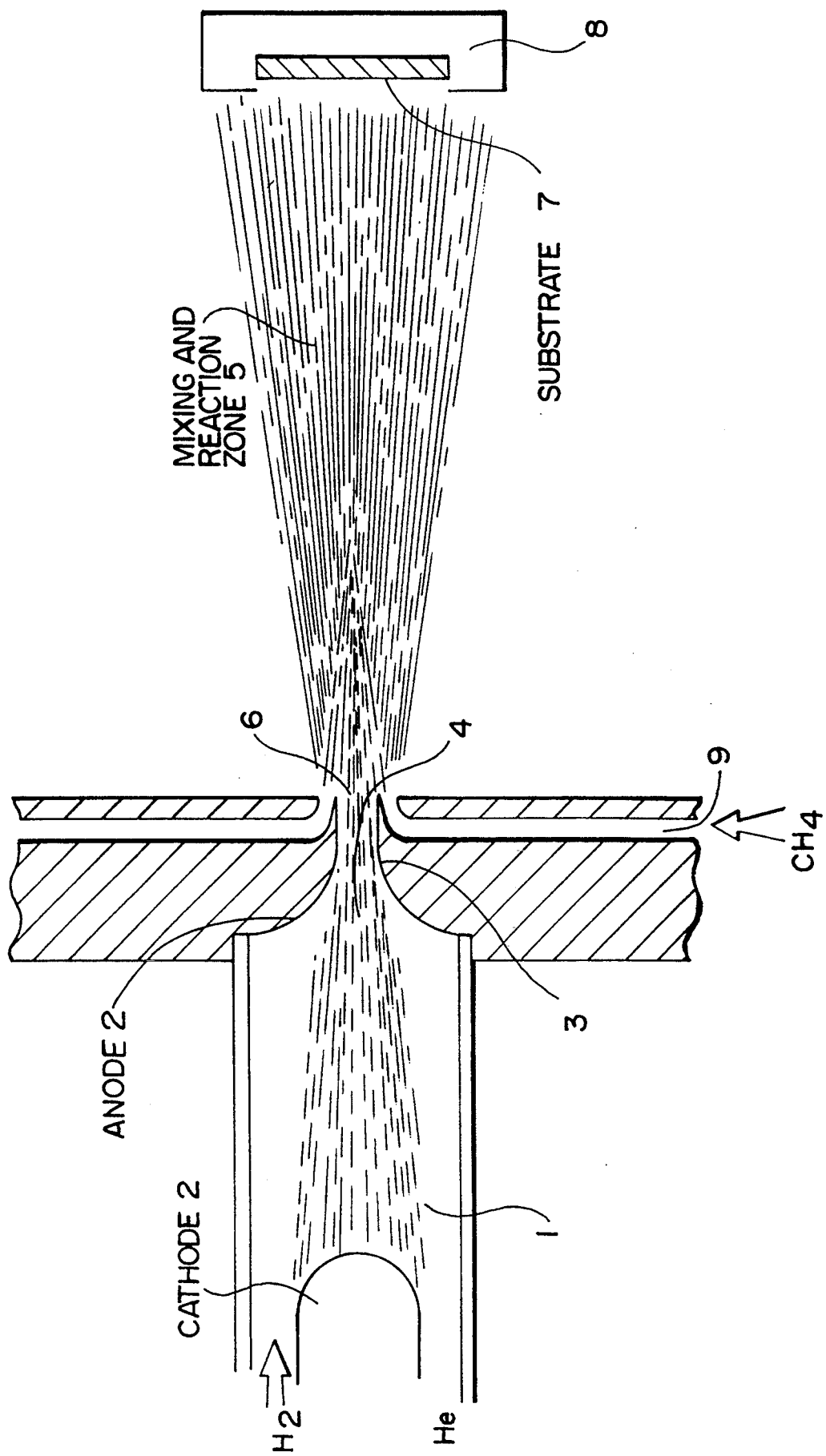

DIAMOND COATED MICROCOMPOSITE SINTERED BODY

This is a continuation of application Ser. No. 07/816,356 filed on Dec. 27, 1991, now abandoned.

BACKGROUND OF THE INVENTION

1. Field of the Invention

The present invention relates to a method for preparing diamond coated substrates, and resultant diamond coated substrates. More specifically, the present invention is directed to a sintered body having a composition comprising a silicide-containing material selected from the group consisting of silicon carbide, silicon nitride, and silicon nitride composite materials coated with a diamond film. Preferably, the present invention is directed to a diamond coated sintered body having a composition comprising microcomposite materials, such as cobalt silicide-containing microcomposite materials, and most preferably cobalt silicide-containing silicon nitride microcomposite materials, which may be produced by coating the microcomposite material, such as with a polycrystalline diamond film. The diamond film on the microcomposite sintered bodies produced in accordance with the present invention is hard and abrasion-resistant. Thus, the diamond coated sintered bodies comprising cobalt silicide-containing microcomposite materials, such as cobalt silicide-containing silicon nitride microcomposite materials, are particularly useful as cutting tools for turning, drilling and milling of non-ferrous alloys, composites, wood, plastics and other materials.

2. Discussion of Background Information

The mechanical, thermal, electrical and optical properties of diamond films offer major advantages in a number of areas ranging from hard surfaces to semiconductors. For example, a diamond-coated carving knife remains sharper, and heads of computer hard disk drives, which occasionally come too close to the surface of the disk, with catastrophic results, may be protected by a diamond coating which is only about 0.03 μm thick.

The high thermal conductivity of diamond which, at room temperature, exceeds that of any other material, and electrical insulating properties of diamond make diamond coatings especially attractive to semiconductor technology. Diamond is unique in that no other material is simultaneously such a good heat conductor and a good electrical insulator. Diamond coatings thus offer the possibility of more densely packed microchips i.e., more transistors per chip with an attendant increase in computer power.

Diamond coatings also offer the possibility of replacing silicon semiconductors, inasmuch as they can be doped to form p- and n-type materials. Inasmuch as diamond has a large electron band gap compared to silicon, the larger electron band gap makes diamond less sensitive to thermal or radiation damage than silicon. Thus, diamond transistors may be used in hostile environments.

Another characteristic of diamond which makes it attractive as a semiconductor is that the high velocity of electron transmission through diamond increases smoothly with increasing electric fields. This is unlike many types of semiconductors. For example, the electron velocity in diamond can be even greater than in gallium arsenide, which is currently considered to be the most expedient high speed semiconductors.

This high electron velocity, coupled with the ability of diamond to sustain a greater electric field than other semiconductors before breakdown, makes diamond a particularly suitable material for high power telecommunication systems.

The optical properties of diamond also make it suitable in a variety of applications. Pure diamond is transparent to photons from the far IR (80 μm) to the UV (230 nm), so diamond coatings have potential for many window applications.

The preparation of diamond coatings using plasma chemical vapor deposition (CVD) has been reported in the prior art. Plasma CVD involves forming a plasma containing activated species using a direct current (dc), low frequency, radio frequency (rf) or microwave discharge, and then contacting a substrate with the plasma to form a diamond coating.

Electrical discharges, such as glows, coronas, arcs, radio frequency and microwave have been studied for many years as tools for forming plasmas containing activated species. Such discharges can generally be divided into low temperature and high temperature systems. Low temperature systems include glows, coronas, electrodeless discharges, and the so-called ozonator type discharges, as well as some RF and microwave discharges, and are collectively known as silent discharge systems. Chemical activation in low temperature systems results in a non-equilibrium product of activated species such as ions and free radicals. The concentration of active species in such plasmas is much greater than would be expected on the basis of equilibrium, i.e., thermal considerations.

In contrast, in high temperature discharges, such as an electrical arc, the concentration of activated species depends upon attaining a thermodynamic equilibrium favoring the activated product. This means that the process of producing active species is inefficient, most of the heat being used to heat the gas. In order to produce a significant amount of activated species, extremely high temperatures, e.g., temperatures of at least 4000° K. are required. Temperatures as high as 10,000° K. to 30,000° K. are not uncommon in arcs. However, the use of such high temperatures in preparing diamond films presents difficulties. Not only does it require a great amount of power, but it results in heating the substrate to the extent that graphite and amorphous carbon may be formed instead of diamond and even in the destruction of the substrate. It also limits the types of substrates that can be used due to problems with the thermal stability of the substrate and differences between the coefficients of expansion of the substrate and the deposited diamond film.

The preparation of diamond films by high temperature plasma CVD is described in Kurihara et al., *Appl Phys. Lett.*, 52(6) 19: pp 437 and 438 (1988) and in European Patent Application 0286306, filed Mar. 30, 1988. In one embodiment a plasma is formed by passing a mixture of methane and hydrogen through an arc discharge. The arc discharge produces activated species in a thermal plasma. The plasma is then passed through a nozzle, expanded to precipitate diamond and then directed onto a substrate.

Methods for preparing diamond films using non-equilibrium plasma CVD have been described.

U.S. Pat. No. 4,767,608, MATSUMOTO et al. is directed to the preparation of carbon films by high temperature plasma CVD, wherein the formation of diamond involves the use of an electric arc discharge which utilizes high temperatures to produce significant amounts of activated species.

The use of a non-equilibrium plasma jet is described in a report entitled "Synthesis of Silane and Silicon in a Non-equilibrium Plasma Jet," authored by H. F. Calcote (Department of Energy/Jet Propulsion Laboratory Report 954560-76/8) which discloses the preparation of amorphous and polycrystalline silicon films which are strongly adhered to Pyrex, Vycor, aluminum or carbon. The plasma is formed using a DC discharge and subsequently expanded through a nozzle to form a plasma jet which is directed upon a substrate. This non-equilibrium plasma jet provides the source of hydrogen atoms via the dissociation of hydrogen gas in an electrical discharge to react with silicon halides.

Diamond coatings have been applied to a carbon steel substrates by first depositing a thin (~200 angstrom) coating of silicon on the substrate. (Appl. Phys. Lett. 58(4), 358–360 (1991). Subsequent diamond coating was carried out using a microwave plasma reactor.

U.S. Pat. No. 4,990,403, entitled "Diamond Coated Sintered Body," describes the significance of being able to deposit a diamond coating on a tough substrate material, such as tungsten carbide. This patent discloses a diamond coated sintered body consisting of a tungsten carbide that contains carbide and/or nitride phases. The carbide and/or nitride phases present in the substrate promotes adhesion of the diamond to the sintered body. Sintering aids such as yttria, alumina, zirconia and magnesia are substituted for cobalt sintering aids which are conventionally used for tungsten carbide.

SUMMARY OF THE PRESENT INVENTION

The present invention is based in part on the discovery that silicides present in silicon nitride and carbide composite materials contribute to improved adhesion of diamond coatings on such composites.

More specifically, the present invention is directed to diamond coated articles comprising a substrate, which comprises a metal silicide-containing composition, and a diamond film at least partially coating the substrate, wherein the preferred substrate is a cutting tool; and processes for producing diamond coated articles which involve contacting a substrate comprising a metal silicide-containing composition with a diamond deposition medium under conditions suitable for forming a diamond film on at least a portion of a surface of the substrate.

The present invention is also directed to compositions of matter comprising a metal silicide-containing composition, and a diamond film at least partially coating the metal silicide-containing composition, and processes for producing diamond coated compositions of matter which involve contacting a metal silicide-containing composition with a diamond deposition medium under conditions suitable for forming a diamond film on at least a portion of a surface of said metal silicide-containing composition.

For purposes of the present invention, the coatings or films of diamond are deposited using a diamond deposition technique selected from the group consisting of halogen-assisted diamond formation, diamond chemical vapor deposition, microwave plasma assisted chemical vapor deposition, hot filament chemical vapor deposition, arc jet deposition, ion beam deposition, and silent discharge plasma jet diamond deposition, and is most preferably accomplished using silent discharge plasma jet diamond deposition.

The metal silicide-containing compositions which are suitable for purposes of the present invention are selected from the group consisting of $M_xSi_y+Si_3N_4$ and $M_xSi_y+SiC$ wherein M is a metal and x and y each is an integer. For purposes of the present invention, the ratio of x:y is $\geq 1$, or $<1$, but is preferably $\geq 1$.

For purposes of the present invention, M is a transition metal; preferred transition metals for purposes of the present invention are those selected from the group consisting of cobalt (Co), iron (Fe), nickel (Ni), and molybdenum (Mo), and mixtures of at least two members selected from the group consisting of cobalt, iron, nickel, and molybdenum.

In accordance with the present invention, the metal silicide composition may be a $M_xSi_y+Si_3N_4$ composition selected from the group consisting of $Co_xSi_y+Si_3N_4$, $Fe_xSi_y+Si_3N_4$, $Ni_xSi_y+Si_3N_4$, and $Mo_xSi_y+Si_3N_4$, and mixtures of at least two members selected from the group consisting of $Co_xSi_y+Si_3N_4$, $Fe_xSi_y+Si_3N_4$, $Ni_xSi_y+Si_3N_4$, and $Mo_xSi_y+Si_3N_4$. Alternatively, the metal silicide composition may be a $M_xSi_y+SiC$ composition selected from the group consisting of $Co_xSi_y+SiC$, $Fe_xSi_y+SiC$, $Ni_xSi_y+SiC$, and $Mo_xSi_y+SiC$, and mixtures of at least two members selected from the group consisting of $Co_xSi_y+SiC$, $Fe_xSi_y+SiC$, $Ni_xSi_y+SiC$, and $Mo_xSi_y+SiC$.

In general, the present invention is directed to substrates which are composed of a metal silicide-containing composition to which a diamond coating is applied.

More specifically, the present invention is directed to forming a very adherent diamond coating upon a cobalt silicide-containing composition, such as silicon nitride microcomposite.

BRIEF DESCRIPTION OF THE DRAWING

The FIGURE shows a basic nonequilibrium plasma jet deposition system.

DETAILED DESCRIPTION

The present invention is suitable for use in connection with sintered ceramics, such as silicon nitride ceramics and silicon carbide ceramics. The present invention is particularly suitable for use with substrates that are composed of silicon nitride ceramic products, for example, as disclosed in commonly owned U.S. Pat. No. 5,023,214, MATSUMOTO and ROSENTHAL, and commonly owned, copending application Ser. No. 07/592,713, filed Oct. 4, 1990 in the name of Matsumoto and Rosenthal, the disclosures of which are incorporated in their entireties by reference thereto herein. The present invention is also particularly suitable for use with substrates which are composed of silicon carbide ceramic products containing a dispersed silicide, as discussed, for example, in commonly owned, copending application Ser. No. 07/779,652, filed Oct. 21, 1991, in the name of Matsumoto, entitled "Silicon Carbide Ceramics Containing A Dispersed Silicide Phase", the disclosure of which is incorporated in its entirety by reference thereto herein.

A preferred example of silicon nitride sintered ceramic products suitable for purposes of the present invention is prepared by (1) intimately mixing a powder mixture composed of (a) from about 50% to about 98% silicon nitride powder, (b) from about 1% to about 50% of at least one metal selected from the group consisting of iron, nickel, molybdenum and cobalt, or an oxide or alloy thereof, and (c) from 0.02% to about 20%, and preferably from about 1% to about 10%, of a sintering aid selected from the group consisting of at least one oxide, nitride or silicate of an element selected from IUPAC (International Union of Pure and Applied Chemistry) groups 2 (alkaline earth metals), 3 (Sc, Y, La, Ac), 4 (Ti, Zr, Hf), 13 (B, Al, Ga, In, Tr) or the lanthanide series, or mixtures thereof, all percentages being by weight based on the total weight of the powder mixture; (2) reacting the components of the powder mixture by heating to a temperature of 1300° C.–1700° C. in a non-oxidizing atmosphere until component 1(b) is converted to its corresponding silicides; and (3) maintaining the powder mixture at a temperature of 1300° C.–1700° C. in the non-oxidizing atmosphere until the composition formed in (2) densifies.

The silicon nitride powder used in the sintered silicon nitride ceramics of this example can be any commercially available silicon nitride powder. As noted above, the silicon nitride is used in an amount of from about 50 to about 98 percent, based on the total weight of the composition. Other refractory compounds, which can be chemically stable or unstable, can replace up to 50% by weight of the silicon nitride. For example, nitrides such as aluminum nitride, titanium nitride and boron nitride; carbides such as silicon carbide, titanium carbide and boron carbide; and borides such as titanium diboride, molybdenum diboride, and zirconium diboride can be used to replace silicon nitride. Mixtures of at least two of these refractory compounds can also be used for this purpose. The refractory compound can be chosen to enhance a particular property of the resulting composite. For example, including titanium carbide or silicon carbide in the composition will give a harder product. The most preferred sintering aid is a combination of aluminum oxide and yttrium oxide.

The silicate sintering aid can be added as such or can be formed in situ by the reaction of an oxide sintering aid or nitride sintering aid with the silica that is always present on the surface of the silicon nitride powder. When a nitride sintering aid is used, it is sometimes desirable to add silica in addition to that which is inherently present on the surface of the silicon nitride. IUPAC group 1 oxides can be substituted for any of the oxide, nitride or silicate sintering aids in an amount of up to 50% by weight.

A binder can be added to the powder mixture as a processing aid during subsequent molding of the material. Suitable binders include, for example, paraffin and other waxes. The amount of binder used is preferably less than 5% by weight, based on the total weight of the composition.

In order to impart optimum properties to the sintered product, the ingredients used to prepare the initial mixture should be finely divided, preferably having a particle size of less than 5 microns, most preferably less than 1 micron.

In order to produce a sintered product of suitable quality, it is important that the finely divided ingredients of the initial mixture be intimately mixed. The ingredients are placed in a mill with a sufficient volume of an aqueous or non-aqueous liquid to form a thick slurry and are milled for 1–48 hours, depending on the particle size desired. Typical liquids useful for non-aqueous milling include, but are not limited to, ethanol, 1,1,1-trichloroethane and methylene chloride. A commercially available dispersant such as HYPERMER KD-2 amine dispersant (ICI Americas) can be added if desired. Suitable mills include, but are not limited to, ball mills, vibratory mills, and attrition mills. Ball and vibratory mills are preferred.

After milling, the slurry that is produced is spray dried to form a free flowing powder. Agglomerates are then removed by sieving the powder through a 200 mesh screen.

The powder mixtures produced in the previously discussed manner are preferably reacted and densified by simultaneously heating and pressing. The preferred processing techniques are selected from the group consisting of hot pressing, hot isostatic pressing and gas pressure sintering.

The components of the powder mixture are heated to a temperature of 1300°–1700° C. until the silicon nitride reacts with the metal, or an oxide or alloy thereof, to form the corresponding high metal content silicide. As used herein, high metal content silicides are those having the formula $M_xSi_y$ wherein M is a metal and the ratio of x:y is $\geq 1$. High metal content silicides of iron include $Fe_3Si$ and $Fe_5Si_3$; examples of high metal content silicide of cobalt include $CoSi$, $Co_2Si$; and high metal content silicides of nickel include $Ni_3Si$, $Ni_5Si$, $Ni_2Si$ and $Ni_3Si_2$. All other metal silicides, i.e., $M_xSi_y$, where M is a metal and the ratio of x:y is $<1$, are referred to as low metal content silicides. Further reactions result in partial conversion to lower metal content silicides. However, a significant fraction of the high metal content silicide, typically greater than 50%, is retained. The mixture of high and low metal content silicides are referred to herein as "mixed metal silicides." If one simply mixes silicon nitride with commercially available metal silicides, which always contain the lower metal content silicide phases, e.g., $CoSi_2$, and $FeSi_2$, only the low metal content silicides would be present in the final product.

The reaction is carried out under a non-oxidizing atmosphere such as nitrogen, hydrogen or helium to prevent oxidation of the metals and the silicon nitride. A nitrogen atmosphere is preferred. The reaction is preferably carried out at a pressure of at least 500 psi, most preferably 2000–6000 psi.

Once the reaction of the silicon nitride and the metal is initiated, the ceramic material is densified by increasing the temperature and pressure within the ranges specified above while maintaining the non-oxidizing atmosphere. If the sintering temperature is too low, densification will be incomplete. If the sintering temperature is too high, the silicon nitride will decompose. The presence of the metal silicides makes it possible to densify at lower temperatures, which in turn allows for retention of a high alpha-phase content in the silicon nitride.

The resultant product is composed of a silicon nitride matrix and microscopic "islands" of either high metal or mixed metal silicides which does not appear to include continuous three dimensional metal or metal oxide phase. Such a composite composition is referred to as a "microcomposite" within the context of this specification. While the exact mechanism is not known, this morphology is believed to occur via a high temperature disproportionation reaction promoted by the sintering aid. The sintering aid provides a liquid phase during heating, which acts as a high temperature "solvent" for both the nitride and the metal (or metal oxide or alloy) and promotes the reaction of silicon nitride with the metal to form either high metal or mixed metal silicides. In the case of cobalt, the X-ray diffraction pattern of the sintered product indicates that the product is composed of silicon nitride and a number of metal silicides of varied stoichiometry, e.g., a combination including CoSi and Co$_2$Si.

The present invention may also involve the use of substrates which are composed of silicon carbide ceramics containing a dispersed silicide, as discussed, for example, in commonly owned, copending application Ser. No. 07/779,652, filed Oct. 21, 1991, in the name of Matsumoto, entitled "Silicon Carbide Ceramics Containing A Dispersed Silicide Phase", the disclosure of which is incorporated in its entirety by reference thereto herein. The sintered silicon carbide ceramic product suitable for this purpose comprises (1) from about 20% to about 98% by weight of alpha-phase, beta-phase or a mixture of alpha- and beta-phase silicon carbide, (2) from about 1% to about 80% of a nonagglomerated, uniformly dispersed, high metal content silicide of iron, nickel, cobalt or molybdenum, and (3) from 0.02% to about 20% of at least one oxide, nitride or silicate of an element selected from IUPAC Groups 2, 3, 4, or the lanthanide series, all percentages being by weight, based on the total weight of the composition.

The silicon carbide used to make the silicon carbide ceramic product as a substrate for diamond coating in accordance with the present invention can be any commercial silicon carbide. It is preferred to use either of the alpha or beta carbide in an amount of from about 50% to about 99% by weight, based on the total weight of the composition. Other refractory compounds that are chemically stable in the presence of silicon carbide can be used to replace up to 50% by weight of the SiC, e.g., titanium carbide, titanium diboride, zirconium carbide, and zirconium diboride.

In the preparation of the silicon carbide ceramics of this embodiment of the present invention, the silicon carbide powder is mixed with from 1% to about 50% by weight, preferably 3% to 20%, based on the total weight of the composition, of molybdenum, iron, cobalt or nickel. An oxide or nitride of these metals, or an alloy of these metals with each other or with another metal can also be used.

As in the previously described examples, the powder mixture also includes from 0.02% to about 20% by weight, preferably from 0.5% to 10% by weight, of compounds that act as sintering aids.

In order to impart optimum properties to the sintered product, the ingredients used to prepare the initial mixture should be finely divided, preferably having a particle size of less than 5 microns, most preferably less than 1 micron. It is important that the finely divided particles be well dispersed, with no aggregates of like materials contained within the powder. This distribution is accomplished by milling the powders in the presence of a dispersant. Milling can be in aqueous or organic solvents, with the choice of dispersants depending upon the solvent used. Common aqueous dispersants are the DARVAN ® series, which are ammonium salts of polyelectrolytes, supplied by R. T. Vanderbilt. The type of mills used can be attrition mills, ball mills, or vibratory mills, with milling times ranging from 1 hour to 100 hours depending upon the size of the initial powders used. Long milling times result in greater milling media wear and short milling times can result in nonuniform mixing and incomplete reduction of particle size. The preferred milling times range from 8 to 24 hours.

After milling, the solvent can be removed, for example, by spray drying. Solvent removal must not result in segregation of the constituent materials into aggregates.

As in the previously described examples of silicon nitride ceramics, the powder mixtures of the silicon carbide ceramics are preferably densified by simultaneously applying heat and pressure, using similarly preferred processing techniques. The preferred sintering temperature range is from 1800° C. to 2,200° C. Higher temperatures can be required in order to densify compositions starting with the alpha phase of silicon carbide. Lower temperatures are desirable when the higher temperatures will result in the conversion of the beta phase to the alpha phase. The pressure used can range from 500 psi to 15,000 psi, preferably 1,000 to 5,000 psi. A nonoxidizing, nonreactive atmosphere, such as argon or helium, is used to prevent reactions between the atmosphere and the constituent powders during sintering.

During sintering, the metal or metal compound reacts with silicon carbide in situ to form high metal content silicides, e.g., Mo$_5$Si$_3$, Fe$_2$Si, Co$_2$Si, CoSi, Ni$_2$Si and Fe$_3$Si. When molybdenum is used, only a small amount of molybdenum carbide is formed in addition to Mo$_5$Si$_3$. This result is unexpected, since existing high temperature thermodynamic data indicate that molybdenum carbide should be more stable than molybdenum silicide. MoSi$_2$ would also be expected to be more stable than Mo$_5$Si$_3$.

The sintered ceramic product comprises (1) from about 20% to about 98% of alpha-phase, beta-phase or a mixture of alpha-D and beta-phase silicon carbide, (2) from about 1% to about 80% by weight of a nonagglomerated, uniformly dispersed, high metal content silicide of iron, nickel, cobalt or molybdenum, and (3) from 0.02% to about 20% of at least one oxide, nitride or silicate of an element selected from IUPAC Groups 2, 3, 4, 13, or the lanthanide series, all percentages being by weight based on the total weight of the composition.

The product is composed of (1) a silicon carbide, (2) a high metal content silicide, and (3) an oxide, nitride or silicate phase between the matrix and the dispersed silicide. The product is useful for applications in which high fracture toughness is desired in SiC ceramics.

In accordance with the present invention, a substrate, such as those previously described, can be given a diamond coating using conventional diamond deposition techniques, such as halogen-assisted diamond formation, diamond CVD coating processes, microwave plasma assisted chemical vapor deposition, hot filament chemical vapor deposition techniques, arc plasma jet deposition, and ion beam techniques. The most preferred diamond deposition technique for purposes of the present invention, however, is a silent discharge process whereby a silent discharge, such as a DC glow discharge, plasma jet procedure is used, for example, as disclosed in commonly owned, co-pending U.S. Ser. No. 07/340,955 filed Apr. 20, 1989 in the name of Calcote, the disclosure of which is incorporated herein in its entirety by reference.

Thus, the most preferred process for providing a substrate with a diamond coating involves first generating a low temperature non-equilibrium plasma gas stream containing activated species through exposure of a first reactant gas moving at a relatively low velocity to a silent electrical discharge. An apparatus for producing a non-equilibrium plasma jet is disclosed in U.S. Pat. No. 3,005,762, the disclosure of which is incorporated in its entirety by reference. The activated species is then expanded through a nozzle to form a low temperature plasma jet into which a carbon source gas is injected, resulting in a plasma jet containing activated carbon species, which contacts the substrate at high velocity to form a diamond coating.

A basic plasma jet deposition system is shown in the FIGURE. A mixture of hydrogen and helium is metered into a discharge chamber 1 at ≈200 torr; a high voltage, low current glow discharge is induced between the space between the electrodes 2 (referred to in the FIGURE as the cathode and the anode) and the nozzle 3. A glow discharge plasma 4 is formed which consists of dissociated hydrogen atoms, ions and other high energy species. The glow discharge plasma 4 is expanded into an expansion chamber 5 (referred to in the FIGURE as the mixing and reacting zone) through an orifice 6, which in this case is a nozzle. A carbon source gas, such as methane ($CH_4$), is injected through line 9 into the plasma jet. The carbon containing species react with the hydrogen atoms and ions in the expanding plasma jet, forming active carbon species (methyl and/or acetylenic radical species) which form continuous, polycrystalline diamond coatings on substrates 7 held in the path of the plasma jet.

The term "nonequilibrium" plasma is used to signify that the energy level distribution in the plasma is not statistically normal; high energy electrons (the origin of the blue "glow" in a glow discharge) excite electron energy levels to a greater extent that other energy levels, e.g., vibration, rotation energy levels, in the plasma. Selective electron energy level excitation results in the selective formation of the activated species responsible for diamond deposition without the concomitant thermal excitation that typically accompanies other plasma forming methods. This gives nonequilibrium discharges a distinct advantage over other less selective methods used to generate a thermal heating of the plasma gas. Deposition rates as high as 5 microns/hr over a 16 $cm^2$ area have been obtained in depositions performed on molybdenum substrates.

The advantage of low temperature glow discharge, rather than a high temperature arc discharge method, is that high quality films are obtained at low deposition temperatures. In the plasma jet processes, an adiabatic expansion of the plasma gas through a nozzle occurs prior to the gas striking the substrate. In the expansion process, some of the kinetic energy of the gas is converted into translational energy which directs active species towards the substrate. The directed nature of the plasma jet allows the deposition of diamond remote from the plasma; this means that lower deposition temperatures are possible. Diamond coatings have been deposited on substrates at temperatures as low as 300° C. A deposition rate of 0.25 microns/hr has been obtained at 300° C. substrate deposition temperature.

The plasma produced by the discharge may initially contain a mixture of hydrogen and carbon containing gases. Preferably, hydrogen is initially present when the plasma is formed by silent discharge and the carbon containing gas is subsequently added downstream of the throat of the nozzle, as shown in the FIGURE. Other reactive gases, e.g., halogen containing gases, can be used instead of or in addition to hydrogen, as long as the plasma gas formed is capable of producing active carbon species that result in diamond deposition. Plasma activated halogen species can create active carbon species in the same manner that hydrogen does by dissociating carbon containing species in the plasma jet.

Representative carbon containing gases include hydrocarbons containing one to four carbon atoms, such as methane; alcohols containing one to four carbon atoms, such as ethanol; other oxygen containing hydrocarbons containing one to four carbon atoms, such as acetone and carbon monoxide; and halogen-containing hydrocarbon containing one to four carbon atoms, such as trichloroethane and difluoroethylene. The mixture may also contain from about 5 to about 30 mol %, preferably about 10 mol %, of an inert or noble gas, such as helium.

The amount of the carbon containing gas added or mixed with the hydrogen can be varied from about 0.1 to about 70 mol % of hydrogen depending on which gas is used. For example, for methane the concentration is preferably from about 0.5 to 3 mol % based on the hydrogen and for carbon monoxide it is preferably from about 10 to 40 mol %.

As shown in the FIGURE, the plasma jet is directed so that it contacts the substrate; the substrate is positioned in the expansion chamber using a substrate holder 8, mounted on a positioning rod (not shown) that allows translation of the substrate towards or away form the nozzle. The substrate will generally be located from about 2 to 30 cm, preferably from about 6 to 10 cm from the nozzle.

The relatively high temperature of the plasma and the great velocity of the plasma jet when it impinges on the substrate will heat the substrate. Under some conditions of operation, it is necessary to cool the substrate. Alternatively, under other conditions of operation, it is desirable to supply additional heat to the substrate, so that the substrate holder can be provided with means of heating the substrate, not shown. The substrate is usually maintained at a temperature between 300° and 1100° K.

Typically, as shown in the FIGURE, the substrate will be oriented substantially perpendicular to the flow of the plasma jet. This will tend to maximize the rate of deposition of the diamond coating. However, the substrate holder can be provided with means for pivoting (not shown) the substrate so that the area which is contacted is increased.

In connection with the discussion of forming diamond coatings using a silent discharge plasma jet process as it relates to the present invention, the term "discharge" is intended to mean a discharge of the silent type characterized by a relatively low gas temperature, as contrasted to the high temperature of an arc discharge.

The term "plasma" is intended to refer to gas which has been activated or excited by the discharge. Such gas is usually characterized by luminosity and usually contains substantial quantities of dissociated species such as free radicals, atoms, ions, and electrons. The term plasma as used herein will be used to indicate gas in any state of excitation or activation resulting from exposure to a discharge of the silent type.

The previously described process as practiced in accordance with the present invention results in the production of diamond coatings on metal silicide-containing substrates instead of any of the many other forms of carbon, such as graphite, amorphous carbon, hydrogenated carbon, glassy carbon or other carbon allotropes.

EXAMPLE 1

A powder formulation was prepared by the vibratory milling of a mixture of 81.9% silicon nitride, 10% cobalt metal, 5.4% yttria, and 2.7% alumina in water using a Southwest Engineering-Company Model M18-5 vibratory (SWECO) mill. The milled sample was then spray dried into a free flowing powder and hot pressed under nitrogen to produce ½" diameter, 3/16" thick substrates.

A diamond coating was successfully deposited on these substrates using the plasma jet CVD diamond coating apparatus shown in FIG. 1 of commonly owned, copending application Ser. No. 07/340,955, filed Apr. 20, 1989, in the name of Calcote, entitled "Process For Forming Diamond Coatings using A Silent Discharge Plasma Jet Process", the disclosure of which is incorporated in its entirety by reference thereto herein. Three ½" diameter composite silicon nitride substrates were held 6 cm from the nozzle exit. The discharge was operated at 3580 Watts (W) while feeding a mixture of hydrogen (832 standard cubic centimeter per second (SCCS)) and helium (65 SCCS) to the discharge chamber. A mixture of 7.15 SCCS of methane and 120 SCCS argon was fed downstream of the jet through line 9. The substrates were resistively heated using a tungsten filament to a temperature of 722° C. A total deposition time of 10.5 hours resulted in a coating thickness of 11 microns over the substrate area exposed to the jet. The presence of diamond was confirmed by raman spectroscopy.

The following examples were conducted to demonstrate the advantages of the present invention for purposes of increasing the hardness of cutting tools by applying a diamond coating to ceramic substrates in accordance with the present invention.

EXAMPLE 2

A powder formulation was prepared by the vibratory milling of a mixture of 80% silicon nitride, 12% Cobalt metal, 5.3% yttria, and 2.7% alumina in water using a SWECO mill. The milled sample was then spray dried into a free flowing powder and hot pressed under nitrogen to produce standard size TPG-322 geometry cutting tool insert blanks.

Diamond was successfully deposited on three of these substrates using the plasma jet CVD diamond coating apparatus shown in FIG. 1 of previously identified U.S. Ser. No. 07/340,955, Calcote. Three TPG-322 silicon nitride microcomposite substrates were held 6 cm from the nozzle exit. The discharge was operated at 3284–3320 W while feeding a mixture of hydrogen (842 SCCS) and helium (65 SCCS) to the discharge chamber. A mixture of 7.15 SCCS of methane and 120 SCCS argon was fed downstream of the jet through line 9. The substrates were resistively heated using a tungsten filament to a temperature of 784° C.–790° C. A total deposition time of 8 hours resulted in a coating thickness between 9 and 15 microns. Three samples prepared in this manner were used in comparative 390 aluminum alloy machining tests discussed in Example 3.

The following examples were conducted to demonstrate the advantages of the present invention for purposes of increasing the wear resistance of metal silicide toughened ceramic cutting tools by the application of a diamond coating in accordance with the present invention.

EXAMPLE 3

Cutting tool inserts were made from the powder mixtures produced in accordance with the procedures disclosed herein in Example 2 and a diamond coating was applied to each cutting tool insert of the present invention using the diamond coating procedure disclosed herein, a representative example of which is described in Example 2.

For comparative purposes, commercially available silicon nitride cutting tool inserts (Greenleaf GSN silicon nitride) were diamond coated using deposition conditions identical to those disclosed in Example 2.

Insert test procedure:

The insert is mounted in a tool holder that is moved along the length of a billet of 390 aluminum/silicon alloy which is mounted on a lathe and turned against the insert at a speed of 2500 surface feet per minute. An aqueous cutting fluid provides cooling and lubrication at the cutting tool workpiece interface during the cutting process. The rate at which the insert is moved by the tool holder into the length of the workpiece from one end to the other parallel to its axis is 0.010 inch per revolution and the depth of cut is 0.025 inches. The average nose and flank wear of the insert is measured after each cut. Cuts are made until 0.015 inches of wear is observed on the nose of the insert, or until delamination of the diamond coating on the nose if the insert is detected. The results of comparative testing are presented in Table I.

TABLE I

| Insert # | Substrate | Diamond Coating Thickness | Material Removed Before Failure |
|---|---|---|---|
| 530 | Greenleaf $Si_3N_4$ | 9.5 microns | 51 cu. in. |
| 533 | Greenleaf $Si_3N_4$ | 8.2 microns | 46 cu. in. |
| 534 | $Co/Si_3N_4$ microcomposite | 14.7 microns | 102 cu. in. |
| 535 | $Co/Si_3N_4$ microcomposite | 11 microns | 74 cu. in. |
| 536 | $Co/Si_3N_4$ microcomposite | 9.1 microns | 85 cu. in. |

EXAMPLE 4

A powder formulation was prepared by the vibratory milling of a mixture of 94.5% beta silicon carbide, 4% cobalt metal, 1% yttria, and 0.5% alumina in water using a SWECO mill. The milled sample was then spray dried into a free flowing powder and hot pressed under nitrogen at 2000° C. to produce a 1" radius semicircular, ¼" thick substrate. Diamond was successfully deposited on this substrate using the plasma jet CVD diamond coating apparatus described in Example 1, except that a deposition temperature of 830° C. was observed. A total deposition time of 7.5 hrs resulted in an adherent coating. The total weight of the deposit was 4 mg. Raman spectroscopy was used to confirm the presence of diamond; a strong peak at 1336 $cm^{-1}$ was found.

Although the invention has been described with reference to particular means, materials and embodiments, from the foregoing, one skilled in the art can easily ascertain the essential characteristics of the present invention; and various changes and modifications can be made to various usages and conditions without departing from the spirit and scope of the invention as described in the claims that follow.

What is claimed is:

1. A diamond coated article comprising a substrate, said substrate comprising at least one transition metal silicide-containing composition comprising $M_xSi_y+$ SiC, wherein M is a transition metal and x and y are each integers, and a diamond film at least partially coating said substrate.

2. The diamond coated article of claim 1, wherein the ratio of x:y is $\geq 1$.

3. The diamond coated article of claim 1, wherein the ratio of x:y is $<1$.

4. The diamond coated article of claim 1, wherein said transition metal is selected from the group consisting of cobalt, iron, nickel, molybdenum, and mixtures thereof.

5. The diamond coated article of claim 1, wherein said substrate further comprises a refractory compound selected from the group consisting of aluminum nitride, titanium nitride, boron nitride, titanium carbide, boron carbide, titanium diboride, molybdenum diboride, zirconium diboride, and mixtures thereof.

6. The diamond coated article of claim 1, wherein said metal silicide-containing composition is selected from the group consisting of $Co_xSi_y+SiC$, $Fe_xSi_y+SiC$, $Mo_xSi_y+SiC$, $Ni_xSi_y+SiC$, and mixtures thereof.

7. The diamond coated article of claim 1, wherein said substrate is a cutting tool.

8. A diamond coated article comprising a substrate, said substrate comprising: (1) from about 20% to about 98% by weight of alpha-phase, beta-phase or a mixture of alpha-phase and beta-phase silicon carbide, (2) from about 1% to about 80% by weight of a nonagglomerated, uniformly dispersed, high metal content silicide of iron, nickel, cobalt or molybdenum, and (3) from about 0.02% to about 20% by weight of at least one oxide, nitride or silicate of an element selected from IUPAC Groups 2, 3, 4, 13, or the lanthanide series, and a diamond film at least partially coating said substrate.

9. The diamond coated composite of claim 8, wherein said at least one oxide, nitride or silicate is present between the matrix of silicon carbide and said dispersed silicide.

* * * * *